United States Patent [19]

Day

[11] Patent Number: 4,551,647
[45] Date of Patent: Nov. 5, 1985

[54] TEMPERATURE COMPENSATED PIEZOELECTRIC TRANSDUCER AND LENS ASSEMBLY AND METHOD OF MAKING THE ASSEMBLY

[75] Inventor: Robert A. Day, Livermore, Calif.

[73] Assignee: General Electric Company, San Jose, Calif.

[21] Appl. No.: 472,871

[22] Filed: Mar. 8, 1983

[51] Int. Cl.⁴ ............ H01L 41/08; H04R 17/00
[52] U.S. Cl. .................. 310/335; 310/346; 29/25.35
[58] Field of Search ............ 310/334–337, 310/346; 29/25.35

[56] References Cited

U.S. PATENT DOCUMENTS

| | | | |
|---|---|---|---|
| 3,387,604 | 6/1968 | Erikson | 310/335 |
| 3,546,012 | 12/1970 | Dixon et al. | 310/335 |
| 3,973,152 | 8/1976 | Karplus | 310/336 X |
| 4,184,094 | 1/1980 | Kopel | 310/335 |
| 4,217,516 | 8/1980 | Iinuma et al. | 310/335 |
| 4,384,231 | 5/1983 | Ishikawa et al. | 310/335 |
| 4,385,255 | 5/1983 | Yamaguchi et al. | 310/335 |

Primary Examiner—Mark O. Budd
Attorney, Agent, or Firm—Ivor J. James, Jr.; Samuel E. Turner; Raymond G. Simkins

[57] ABSTRACT

An ultrasonic transducer for use in a high temperature environment and method for fabricating the same. A disk-shaped piezoelectric crystal is weakened in at least one surface in accordance with a predetermined line pattern relative to a first direction in that surface. The crystal is bonded to a thin lens material with a coefficient of thermal expansion dissimilar in this first direction. The predetermined line pattern is adapted to relieve stress in this first direction created by unequal rates of expansion or contraction of the crystal and the lens.

33 Claims, 11 Drawing Figures

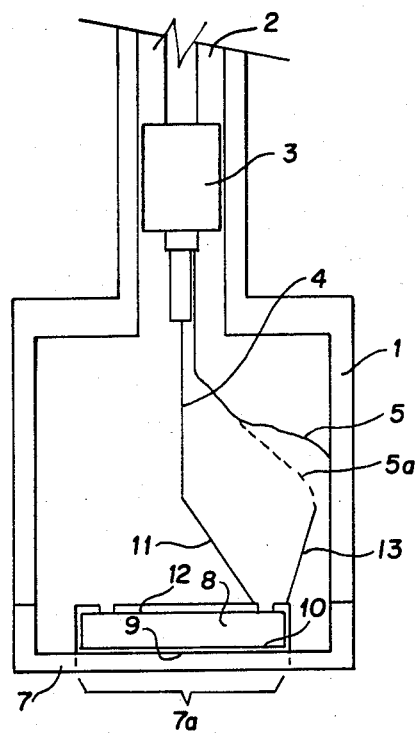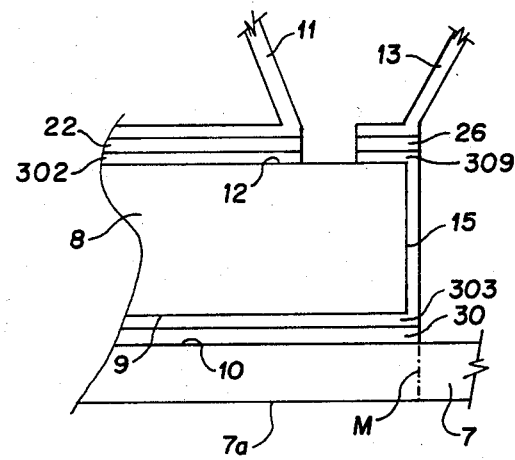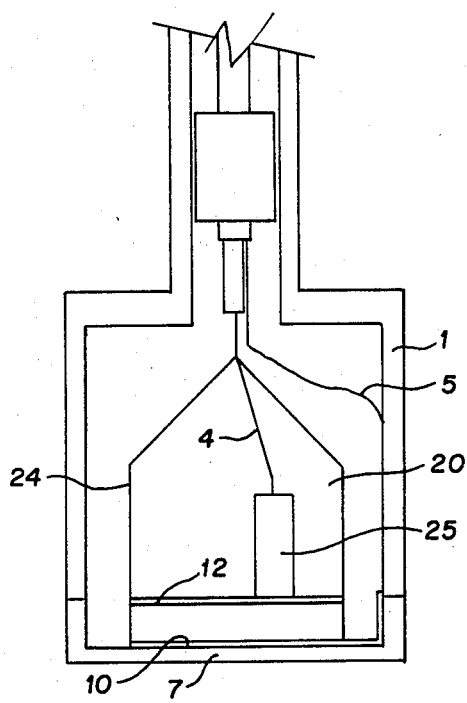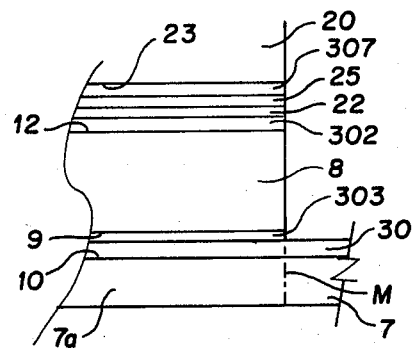
Fig. 1
Fig. 1A
Fig. 2
Fig. 2A

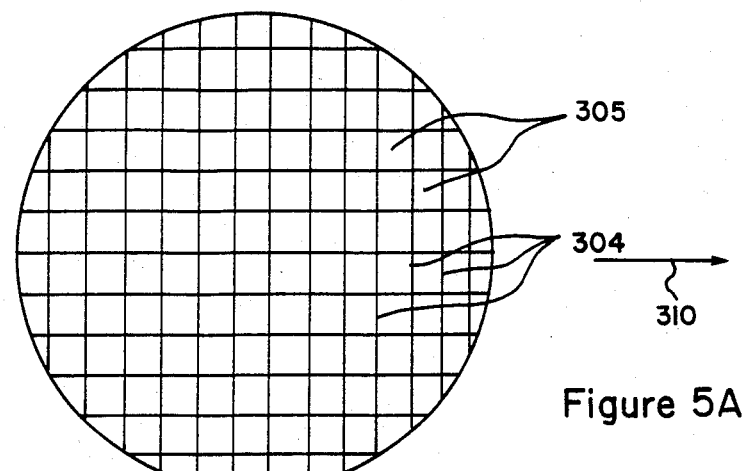
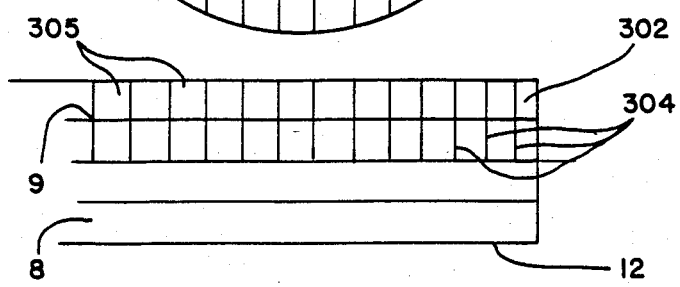
Figure 5A
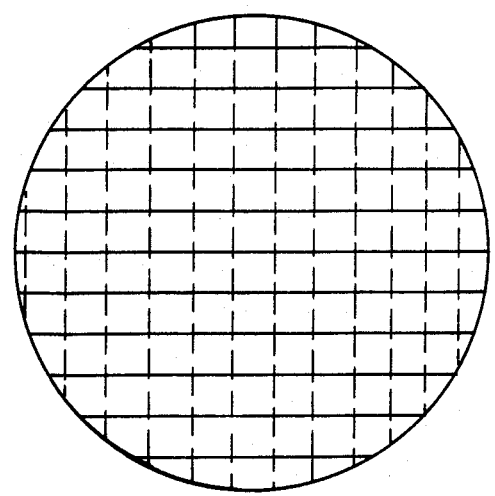
Figure 5B
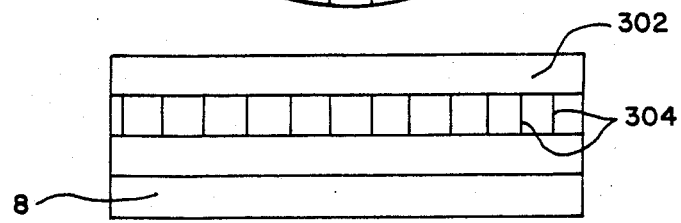

TEMPERATURE COMPENSATED PIEZOELECTRIC TRANSDUCER AND LENS ASSEMBLY AND METHOD OF MAKING THE ASSEMBLY

This invention relates generally to a transducer for generating and detecting acoustical energy in a high temperature environment and in particular to piezoelectric transducers and the method of making them.

BACKGROUND OF THE INVENTION

In liquid cooled nuclear reactors fuel elements may be advantageously monitored by the use of ultrasonic transducers. Such monitoring includes imaging the structure of fuel pins to ascertain their location and type. In addition, it is possible to detect the presence of minute ruptures in the outer cladding surface of fuel elements. Imaging and detection is achieved by transmitting ultrasonic waves into the reactor and analyzing the reflected waves. A typical transducer for this purpose may consist of a laminate including one or more slabs of a piezoelectric crystal contacted by electrodes and protected by a lens from the hostile environment in which it must operate. The function of the lens is to isolate the crystal from the surrounding liquid coolant and thereby prevent its degradation. Thus, the transfer of acoustic energy to or from the crystal occurs by way of the lens and hence the lens and crystal must be in intimate contact with each other.

Heretofore, one technique of joining the lens and crystal has been by means of compression. The technique consists of compressing a crystal between two lenses, using mechanical means such as bolts or springs. As the pressure is necessarily high (500–1000 psi) to assure proper coupling of the acoustic waves into or out of the crystal, a relatively thick lens is required. If the lens is too thin it tends to deform, thereby stressing the crystal and resulting in a crystal fracture. A salient disadvantage of the thick lens necessitated by the compression technique is that the lens degrades the high performance and fidelity of the transducer.

Another technique heretofore known is to braze the lens to the crystal. This allows the selection of a lens of a thickness considerably less than that used in the above described compression technique. However, one of the problems associated with brazing is that the coefficients of thermal expansion of the lens and crystal in their mating surfaces must match in order to prevent irregular fracturing of the crystal. Alternatively, the lens material must be sufficiently weak to allow it to flex. A further complicating factor is the fact that the coefficient of thermal expansion of a piezoelectric crystal generally varies with its crystallographic direction. Hence, to achieve a perfect match of the thermal coefficients of the crystal and lens is virtually impossible.

At temperatures below 200° C. it is possible to match the coefficients of thermal expansion of certain crystals with certain lens materials. For instance, the piezoelectric crystal material known as PZT-5 has a symmetric thermal expansion coefficient. Thus, it has been successfully bonded to stainless steel having an approximately matching coefficient of expansion. The use of PZT-5 material is, however, precluded at higher temperatures because the stress resulting from the thermal mismatch at these temperatures becomes too great for the crystal to withstand. Moreover, the Curie temperature of PZT-5 material is 250° C., which serves as an absolute limit on its useful range.

OBJECTS OF THE INVENTION

It is a primary object of the present invention to provide a new and improved piezoelectric crystal transducer and method of fabrication thereof, which avoid the disadvantages and limitations of the prior art.

It is another object of the present invention to provide a new and improved piezoelectric crystal transducer and method of fabrication thereof in which a piezoelectric crystal is bonded to a lens of narrow thickness having a coefficient of thermal expansion different from the crystal, and wherein the crystal is able to withstand the stresses and strains resulting from the unequal expansion or contraction of the bonded surfaces.

A further object of the invention is to provide a new and improved piezoelectric crystal transducer wherein the electrodes facilitate the establishment of electrical contact with the crystal, using either a conductive or a non-conductive lens material.

SUMMARY OF THE INVENTION

A transducer in accordance with the present invention comprises a piezoelectric crystal, at least one lens and electrical connections to the crystal. The crystal has first and second opposite crystal surfaces and the crystal structure is weakened in at least one of the surfaces in accordance with a predetermined line pattern. The line pattern may be scribed or otherwise laid down on the crystal surface. One surface of the lens conforms to a crystal surface and is bonded thereto. An electrical connection is provided to each of the crystal surfaces. The lens and crystal have dissimilar coefficients of expansion in at least one direction in their conforming surfaces. The line pattern has a predetermined orientation relative to this direction so as to relieve stress in the crystal due to any unequal expansion or contraction between the crystal and the lens.

These and other objects of the invention, together with the features and advantages thereof, will become apparent from the following detailed specification when read in conjunction with the accompanying drawings in which applicable reference numerals have been carried forward.

BRIEF DESCRIPTION OF THE DRAWINGS

FIG. 1 is a partial cross-sectional view of a preferred embodiment of an ultrasonic transducer in accordance with the present invention.

FIG. 1A is an expanded view of a portion of the apparatus shown in FIG. 1.

FIG. 2 illustrates a modification of the invention shown in FIG. 1, which uses a further crystal as a backing member.

FIG. 2A is an expanded view of a portion of the apparatus shown in FIG. 1.

FIG. 5A shows top and cross-sectional views of a piezoelectric crystal for use in the present invention, which illustrates scribing subsequent to electroding.

FIG. 5B shows top and cross-sectional views of a piezoelectric crystal for use in the present invention which illustrates scribing prior to electroding.

DETAILED DESCRIPTION OF THE INVENTION

Figure 3A:
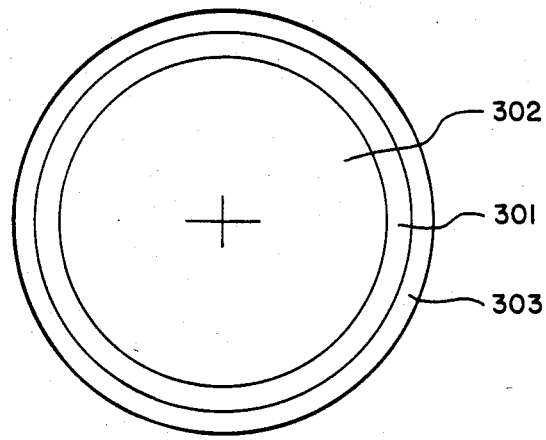
FIGS. 3A and 3B are top and side views respectively, of a piezoelectric crystal for use in the transducer of FIG. 1.

FIG. 1 illustrates an ultrasonic transducer which includes a substantially bottle-shaped casing 1 in a preferred embodiment of the invention. Casing 1, which may consist of a material such as stainless steel, narrows at one end to provide an opening 2 in which a plug 3 is disposed. The plug, which is nonconductive, allows for the passage of wires 4 and 5. It is sealed to casing 1 by means of a metal braze or glass bond so as to prevent the passage of ambient fluids in the event of a lens or casing failure.

At the opposite end of casing 1 a substantially cup-shaped lens structure 7 is hermetically sealed to the casing. A piezoelectric crystal 8 is bonded to the lens. The portion of lens structure 7 which is coextensive in diameter with adjacent crystal 8, is delimited by phantom line m, as shown in enlarged view in FIG. 1A and is referred to herein as lens 7a. The thickness of lens 7a is preferably equal to ¼ the wavelength of the resonant frequency of the crystal. Crystal 8 is preferably disk-shaped and has two opposite crystal surfaces 9 and 12. Crystal surface 9 is planar in the preferred embodiment of the invention and it conforms to planar interior lens surface 10. Crystal surface 12 is parallel to surface 9.

In the fabrication of the transducer, lens surface 10 is bonded to crystal surface 9 by brazing material 30, as shown in FIG. 1A. Bonding may be effected by means of a conductive brazing material such as nickel, gold or platinum, or with a non-conductive brazing material such as glass. In accordance with the present invention, prior to such bonding the surface of crystal 8 is weakened consistent with a predetermined line pattern so as to relieve stress in the crystal that may occur due to unequal rates of expansion of the crystal and the lens.

The parameters which influence the selection of an appropriate line pattern include the type and cut of crystal 8 and the material of lens 7a. Initially, only certain piezoelectric crystals are useful at reactor coolant temperatures of 650° C. With Curie temperatures well in excess of 650° C., two such crystals are lithium niobate and tourmaline. Lithium tantalate may also have application, although its use in liquid sodium is somewhat limited owing to its Curie temperature of 660° C. In order to optimize the efficiency of the crystal transducer, different crystallographic cuts can be made. In one embodiment of the invention, 36° Y-cut lithium niobate best meets the requirements.

The lens material is selected to match as nearly as possible the expansion coefficient of the crystal. Perfect matching of expansion coefficients is precluded due to the fact that the expansion coefficient of piezoelectric crystals such as lithium niobate and tourmaline vary with the crystallographic direction. For example Kovar, which may find application as a lens material, has an expansion coefficient which approximately matches that of 36° Y-cut lithium niobate in one direction. Aluminum oxide is also adaptable for use as a lens material. By the controlled addition of oxides of materials such as sodium and potassium, the expansion coefficient of aluminum oxide may be modified to more nearly match that of the crystal selected.

In one situation, which exists when 36° Y-cut lithium niobate is to be bonded to a Kovar lens, the maximum mismatch between the expansion coefficients of the lens and crystal lies in a first direction in the plane of crystal surface 9. The expansion coefficients match in this plane in a second direction, which is 90° displaced with respect to the first direction. Maximum stress occurs in the first direction and may be relieved by weakening the surface of the crystal with a series of lines parallel to the second direction. FIG. 5A illustrates the above described line pattern for a disk-shaped crystal. Kerf lines designated 304 in the drawing are seen to be at 90° with respect to the aforesaid first direction 310. Kerf lines 304 may be scribed, cut, scored, or otherwise incised into crystal 8. The uniform distance between successive scribed lines, the width and depth of the kerf lines and the thickness of the crystal are all determined by the desired operating characteristics of the transducer.

In one embodiment of the invention, a 36° Y-cut lithium niobate crystal, designed to resonate at 5 MHz, has a thickness of approximately 29 mils. At this value, the distance between the lines is in the range between 0.5 and 1.0 mm and the depth of the kerf lines is about 1/10 the thickness of the disk. The width of each kerf line is kept as small as possible to avoid excessive loss of crystal area with a concomitant reduction of the area of the transducer surface. Diamond saw blades are available to cut widths as small as 0.0035 inches and diamond tipped needles have achieved kerf widths between 25 and 75 um.

Figure 6:
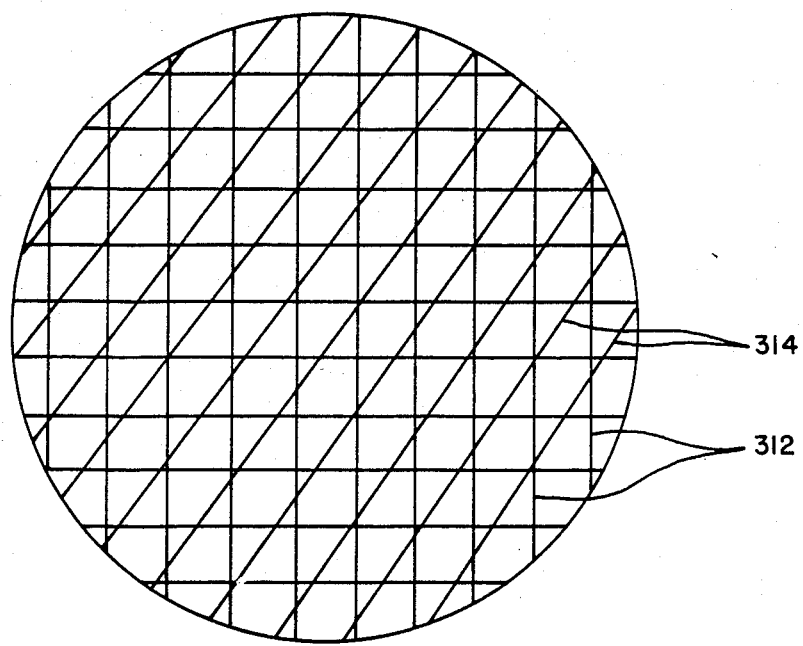
FIG. 6 is a top view of a piezoelectric crystal, which illustrates an alternate embodiment for scribing the crystal.

In another embodiment of the invention, the expansion coefficients of the crystal and lens may be mismatched in all directions in the plane of crystal surface 9. As shown in FIG. 6, in the latter situation the crystal may be weakened by two series of straight, parallel lines 312 and 314 scribed into the crystal surface to relieve stress in more than one direction. The lines intersect so that the resulting weakening pattern preferably takes the form of parallelograms.

It will be clear to those skilled in the art that, for a given line pattern, the structure of the crystal may be weakened in various ways and that it is not limited to scribing, scoring or cutting lines into the crystal surface. Nor is the pattern used for weakening the crystal structure limited to the above-described straight line patterns and it will be clear that other geometries may be used, for instance a series of concentrically scribed circles. It should also be noted that one, or both of crystal surfaces 9 and 12 may be weakened.

Referring again to FIG. 1A, metal brazing material 30 is interposed between crystal 8 and lens 7a. Prior to brazing a thin film 303, which forms one of the electrodes of the crystal, is applied to crystal surface 9 for the purpose of improving the adhesion of metal braze 30 to the crystal surface. The electrode film 303 may be applied to the crystal surface by any conventional method. For example, RF sputtering may be used to deposite a film consisting of 0.1 um of titanium, 1 to 2 um of molybdenum, and 1 to 2 um of nickel. In similar manner, a thin film 302 may be applied to crystal surface 12 to provide an improved surface for bonding metal foil 11 to that surface and to serve as the other electrode of the crystal.

Figure 3B:
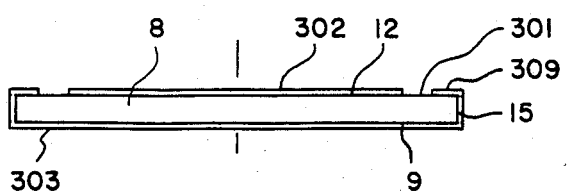

It will be clear to those skilled in the art, that the aforesaid electrode films may be deposited in a number of different geometric configurations on their respective crystal surfaces. Thus FIGS. 3A and 3B show films 303 and 302 as being disposed on opposite crystal surfaces 9 and 12 respectively, of disk-shaped crystal 8. However, while film 302 occupies only a portion of the total disk surface 12 and does not extend to the edge of the crystal disk, it will be seen that electrode 303 extends from surface 9, across disk edge surface 15, to surface 12 where it occupies a concentric, marginal portion 309. On surface 9, a concentric circular band 301 remains bare and thus establishes electrical isolation between the two electrodes constituted by films 302 and 303. The electrode configuration so established facilitates electrical connections to the crystal by providing contact points on the same side of the disk.

In the embodiment illustrated in FIGS. 1 and 1A, which uses the construction explained above in connection with FIG. 3, a pair of metal foils 11 and 13 are braze-bonded, by brazing materials 22 and 26, to electrode films 302 and 303 respectively. These foils establish the appropriate connections between the electrode films and wires 4 and 5.

In an alternative configuration, electrode film 303 may be applied solely to crystal disk surface 9 and electrode film 302 may be applied solely to crystal disk surface 12. With such an arrangement, crystal disk edge surface 15 remains bare, thereby electrically isolating electrodes 303 and 302. This arrangement is preferable where another structure, e.g. a crystal backing member, is positioned in contact with crystal surface 12.

Figure 4A:
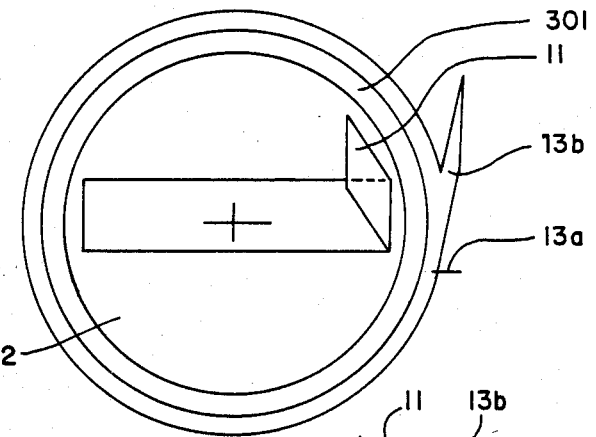
FIG. 4A is a top view of a piezoelectric crystal with an exemplary embodiment for attaching electrodes.
Figure 4B:
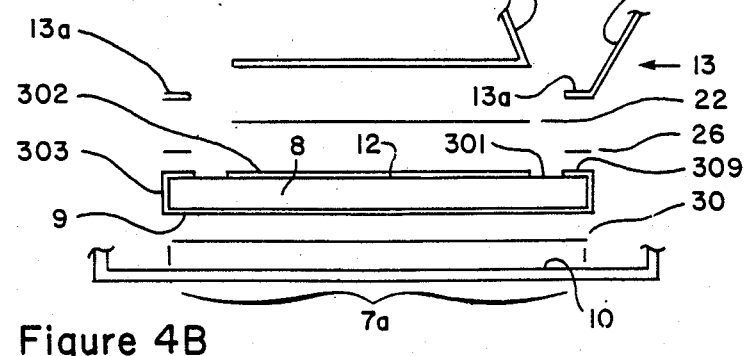
FIG. 4B is an exploded side view of the apparatus of FIG. 4A.

FIG. 4A shows a top view and FIG. 4B an exploded cross-sectional view of a piezoelectric crystal with an exemplary arrangement for attaching electrodes. As described above, electrode films 303 and 302 are separated by concentric circular band 301 of bare crystal and provide the respective electrical contacts to opposite crystal surfaces 9 and 12. A portion of foil strip 11 is bonded to electrode film 302 by metal braze 22. A second foil member 13 comprises a substantially ring-shaped foil portion 13a and foil strip handle 13b. Ring-shaped foil portion 13a is bonded by metal braze 26 to marginal portion 309 of electrode film 303, which overlies crystal surface 12.

The above-described electrode arrangement of crystal 8 is applicable when the crystal is bonded to lens 7a with a metal brazing material. Occasionally it is convenient to bond lens surface 10 to crystal surface 9 with a brazing material such as glass. In such a case, no electrode film need be applied to crystal surface 9 for the reason that glass bonds best to oxide material such as piezoelectric crystal. Although the insulative value of the glass brazing material between the crystal and the lens tends to degrade the performance of the transducer in such an arrangement by decreasing its efficiency, the glass layer is sufficiently thin so as to provide acceptable performance.

Lens surface 10 must similarly be either electroded or left bare prior to brazing, depending on the type of brazing material and lens employed. If a non-oxide material such as Kovar is used for the lens, the lens surface 10 must be oxidized prior to glass brazing. In one embodiment of the invention, wet nitrogen is used to perform the oxidation process on the Kovar lens.

When glass brazing is used to bond the crystal to a conductive lens such as Kovar, the lens structure 7 and metal casing 1, which are physically joined together, can serve as one electrode. Thus, wire 5 shown in FIG. 1, may be spot welded or brazed to the interior of casing 1 to provide the desired electrical connection. Otherwise, wire 5 may be similarly connected to metal foil 13 as shown by line 5a. When glass brazing is used to bond crystal surface 9 to lens surface 10 and surface 10 consists of an oxide material such as aluminum oxide, no electroding of lens surface 10 is necessary since, again, glass bonds best to an oxide material.

If metal brazing is used to join lens surface 10 to crystal surface 9, the composition of the lens determines whether its surface must be prepared prior to such brazing. In one embodiment, lens surface 10 of a lens consisting of oxide material such as alumina, is electroded with the above-described metallic film, thereby improving the adhesion quality of the lens surface. In an alternative embodiment, a metallic lens such as Kovar is left untreated prior to bonding.

As discussed above, crystal surface 9 is weakened by scribing a line pattern in order to relieve the stress that occurs when the crystal and lens, which are bonded together, expand or contract unequally in at least one direction in the plane of their conforming surfaces. Such scribing may occur prior or subsequent to the application of the electrode film. FIG. 5A shows piezoelectric crystal 8 weakened by scribing lines 304 subsequent to the application of electrode film 302. In this embodiment the scribed lines penetrate electrode film 302, thereby electrically isolating individual strips 305 of film 302. However, it will be understood that the distances involved are sufficiently small due to the narrowness of the scribed lines that overlying brazing will bring these strips into electrical contact with each other. In contrast, FIG. 5B shows an embodiment with piezoelectric crystal 8 weakened by scribing lines 304 prior to application of electrode film 302. The subsequentially applied electrode film does not contain any kerf lines.

FIG. 2 illustrates an alternative embodiment of an ultrasonic transducer wherein a backing member 20 is used. The backing member, which may consist of the same material as the crystal, performs a damping function by reducing ringing of the crystal. This results in enhanced axial resolution of the ultrasonic beam. The use of identical material for the backing member and crystal serves to eliminate stress between them, which may otherwise develop from a thermal mismatch. In the embodiment shown in FIG. 2, backing member 20 preferably is configured in the shape of a cone-topped cylinder.

In the arrangement shown in FIG. 2, lens structure 7 is bonded to crystal 8 substantially as described with respect to FIG. 1 where no backing member is used. The necessity for placing backing member 20 in direct contact with substantially the entire crystal surface 12 precludes the geometric configuration of electrodes as shown in FIG. 3A and 3B. Rather, in the embodiment shown in FIG. 2A, electrode films 303 and 302 are applied only to opposite crystal surfaces 9 and 12 respectively when bonding of lens, crystal and backing member is by means of metal brazing 30 and 22. Backing member surface 23 is metallized with an electrode film 307 prior to being bonded to crystal surface 12 by means of metal braze 22.

Regardless of whether a conductive or a non-conductive brazing material is used to bond the lens to the crystal, one electrical connection to the crystal is as shown in FIG. 2, i.e. through casing 1 and wire 5. In this embodiment lens structure 7 consists of a non-conductive material. As best seen from FIG. 2A, in order to establish an electrical connection to casing 1, conductive material 30 extends beyond lens surface 10 on the interior surface of lens structure 7 and, further, beyond the junction of the latter and casing 1. In an alternative embodiment in which the lens structure is selected from a conductive material, no such extension of the conductive material is required.

A second electrical connection to the crystal is established through metal foil 25 and wire 4. In one embodiment of the invention, a strip portion of metal foil 25, shown in FIG. 2, overlies a portion of side surface 24 of backing member 20 and is bonded thereto by a metal film. A further portion of metal foil 25, shown in FIG. 2A, is disposed between crystal surface 12 and backing member surface 23. This further portion is bonded to backing member surface 23 by metal film 307.

The piezoelectric transducer described and illustrated herein is capable of operating in a high temperature environment with a relatively thin lens. The stress of unequal expansion or contraction in the bonded surfaces of the crystal and lens is relieved by weakening the structure of the piezoelectric crystal prior to bonding it to the lens. The resultant transducer is capable of improved operation over those heretofore known.

It will be clear to those skilled in the art that the present invention is not limited to the specific embodiments described and illustrated herein. Nor is the invention limited to the manufacture and production of single element transducers, but it applies equally to plural element transducers, such as are found in phased arrays. Similarly, the present invention applies to transducers for high temperature applications, as well as to any transducer which experiences thermal change and where a piezoelectric crystal is bonded to a material having a different expansion coefficient. It is also possible to fabricate a transducer which has more than one lens with the inventive method disclosed herein. Such a transducer, for example, is useful where it is desired to transmit and/or receive ultrasonic energy in more than one direction.

It will be understood that the dimensions and the proportional and structural relationships shown in the drawings are illustrated by way of example only and that these illustrations are not to be taken as the actual dimensions or proportional structural relationships used in the transducer of the present invention.

While certain embodiments of the present invention have been disclosed herein, it will be clear that numerous modifications, variations, changes, full and partial equivalents will now occur to persons skilled in the art without departing from the spirit and scope of the invention. Accordingly, it is intended that the invention be limited only by the spirit and scope of the appended claims.

What is claimed is:

1. An ultrasonic transducer comprising:
   a piezoelectric crystal including first and second opposite crystal surfaces, the structure of said crystal being weakened in at least one of said surfaces in accordance with a predetermined line pattern;
   at least one lens having a first lens surface conforming to said first crystal surface and being bonded thereto;
   said conforming surfaces of said lens and said crystal having dissimilar coefficients of expansion in at least a first direction along said conforming surfaces;
   said pattern having a predetermined orientation relative to said first direction; and
   means for providing electrical connections to said first and second crystal surfaces respectively;
   whereby said weakened crystal structure is adapted to relieve stress in said crystal caused by unequal expansion or contraction between said crystal and said lens in said first direction.

2. The transducer of claim 1 wherein the structure of said crystal is weakened by a scribed line pattern in at least one of said crystal surfaces.

3. The transducer of claim 2 wherein said scribed line pattern comprises at least one series of parallel lines.

4. The transducer of claim 3 wherein the structure of said crystal is weakened by a pattern of scribed, parallel lines in both of said crystal surfaces.

5. The transducer of claim 2 wherein said lens is conductive and provides said electrical connection to said first crystal surface through a thin film therebetween.

6. The transducer of claim 2 wherein said means for providing an electrical connection to said second crystal surface includes a conductive film deposited on said second crystal surface clear of a portion along the margin thereof;
   said means for providing an electrical connection to said first crystal surface including a conductive film deposited on said first crystal surface, said last-recited film extending across the edge of said crystal to said marginal portion of said second crystal surface;
   said conductive films being mutually spaced on said second crystal surface; and
   a pair of connectors conductively coupled to respective ones of said mutually spaced films on said second crystal surface.

7. The transducer of claim 3 wherein said lens and said crystal have substantially equal coefficients of thermal expansion in at least a second direction in said conforming surfaces; and
   wherein said scribed lines are substantially parallel to said second direction.

8. The transducer of claim 7 wherein said first and second crystal surfaces are planar and parallel to each other, and the distance between said crystal surfaces is selected in accordance with the desired frequency response of said crystal.

9. The transducer of claim 8 wherein said crystal is substantially disk shaped.

10. The transducer of claim 8 wherein said distance between said crystal surfaces is substantially equal to $\frac{1}{4}$ wave length of the resonant frequency of said crystal.

11. The transducer of claim 10 in which said crystal consists of 36° Y-cut lithium niobate; and
    wherein said lens consists of Kovar.

12. The transducer of claim 11 wherein said scribed lines have a depth of approximately 1/10 the thickness of said crystal between said opposite crystal surfaces and a width of less than 75 um, said scribed lines being uniformly spaced from each other at intervals in the approximate range of 0.5 to 1.0 mm.

13. The transducer of claim 2 in which said crystal is selected from the group of materials consisting of lithium niobate, lithium tantalate and tourmaline.

14. The transducer of claim 2 in which the material of said lens is selected from the group consisting of Kovar, aluminum oxide, and aluminum oxide doped with small amounts of contaminating oxides.

15. The transducer of claim 3 in which said scribed line pattern comprises two series of intersecting parallel lines on said at least one crystal surface so as to form parallelograms thereon.

16. The transducer of claim 2 wherein said lens constitutes a portion of a protective lens structure configured to surround said crystal in part; and
further including a protective casing configured to substantially completely surround said crystal in cooperation with said protective lens structure;
whereby said casing and said lens jointly shield said crystal from its ambient environment.

17. The transducer of claim 16 wherein said lens structure and said casing jointly form a shell of substantially uniform thickness.

18. The transducer of claim 2 and further comprising a backing member bonded to said second crystal surface, said backing member being adapted to provide a damping function relative to said crystal.

19. The transducer of claim 18 wherein said backing member is configured in the shape of a cone-topped cylinder.

20. The transducer of claim 19 wherein said crystal and said backing member consist of substantially the same material.

21. An improved transducer comprising:
a protective lens;
a piezoelectric crystal bonded to said lens at mutually conforming lens and crystal surfaces, the structure of said crystal being weakened in accordance with a predetermined line pattern; and
means for providing electrical connections to said crystal;
whereby the weakened crystal structure is adapted to relieve stress in said crystal when unequal expansion or contraction occurs between said bonded lens and crystal surfaces.

22. The transducer of claim 21 wherein the structure of said crystal is weakened by a scribed line pattern at least on said conforming crystal surface.

23. The transducer of claim 21 wherein said scribed line pattern comprises a series of parallel lines.

24. A method of fabricating an ultrasonic transducer comprising:
weakening the structure of a piezoelectric crystal in at least one of first and second parallel crystal surfaces in accordance with a predetermined line pattern, said line pattern having a predetermined orientation relative to a first direction in said weakened crystal surface; and
bonding a lens to said first crystal surface at a first lens surface which conforms to said first crystal surface, said first lens surface being positioned relative to said first crystal surface such that the coefficients of thermal expansion of said lens and of said crystal are dissimilar in said first direction;
whereby said line pattern is adapted to relieve stress in said crystal upon unequal expansion or contraction between said crystal and said lens in said first direction.

25. A method as recited in claim 24 wherein said lens constitutes a portion of a protective lens structure adapted to surround said crystal in part;
said method further comprising the step of surrounding the remainder of said crystal with a protective casing;
whereby said casing and said lens structure cooperate to form a surrounding shell which shields said crystal from its ambient environment.

26. A method as recited in claim 24 wherein the step of weakening said crystal structure comprises scribing said line pattern on said at least one crystal surface.

27. A method as recited in claim 24 wherein the step of weakening said crystal structure comprises scribing said line pattern on said first and second crystal surfaces.

28. A method as recited in claim 26 wherein said lens and said crystal have expansion coefficients which are substantially equal in at least a second direction in said conforming lens and crystal surfaces; and
wherein said step of weakening said crystal structure comprises scribing a set of straight lines on said at least one crystal surface parallel to said second direction.

29. A method as recited in claim 28 wherein said parallel lines are scribed uniformly spaced from each other.

30. A method as recited in claim 26 wherein said lens and said crystal have expansion coefficients which are substantially dissimilar in all directions in said conforming surfaces; and
wherein said step of weakening said crystal structure comprises scribing two series of intersecting parallel lines on said at least one crystal surface so as to form parallelograms thereon.

31. A method as recited in claim 24 wherein said first and second crystal surfaces are planar and parallel to each other; and
further including the step of providing electrical connections to said crystal surfaces.

32. A method as recited in claim 28 wherein said parallel lines are scribed on said at least one crystal surface with an uniform spacing in the approximate range of 0.5 to 1.0 mm, and to a depth of approximately 1/10 the thickness of said crystal between said first and second surfaces, said lines being scribed with a width of less than 75 um.

33. A method as recited in claim 24 and further comprising the step of bonding a backing member to said second crystal surface such that the bonded backing member surface conforms to said second crystal surface.

* * * * *